(12) United States Patent
Inaba et al.

(10) Patent No.: US 11,028,005 B2
(45) Date of Patent: Jun. 8, 2021

(54) GLASS FOR SEMICONDUCTOR PROCESSING

(71) Applicant: AGC Inc., Tokyo (JP)

(72) Inventors: Seiji Inaba, Tokyo (JP); Kazutaka Ono, Tokyo (JP)

(73) Assignee: AGC INC., Tokyo (JP)

( * ) Notice: Subject to any disclaimer, the term of this patent is extended or adjusted under 35 U.S.C. 154(b) by 0 days.

(21) Appl. No.: 17/006,271

(22) Filed: Aug. 28, 2020

(65) Prior Publication Data

US 2021/0024402 A1   Jan. 28, 2021

Related U.S. Application Data

(63) Continuation of application No. PCT/JP2019/028892, filed on Jul. 23, 2019.

(51) Int. Cl.
*C03C 3/068* (2006.01)
*H01L 21/683* (2006.01)

(52) U.S. Cl.
CPC .......... *C03C 3/068* (2013.01); *H01L 21/6835* (2013.01); *H01L 2221/68372* (2013.01); *H01L 2221/68386* (2013.01)

(58) Field of Classification Search
CPC ................ C03C 3/068; H01L 21/6835; H01L 2221/68386; H01L 2221/68372
USPC .......................................................... 501/78
See application file for complete search history.

(56) References Cited

U.S. PATENT DOCUMENTS

| 7,319,052 B2 * | 1/2008 | Tomoda | H01L 21/268 |
| | | | 257/E21.122 |
| 8,110,515 B2 * | 2/2012 | Shimizu | C03C 3/068 |
| | | | 501/78 |
| 9,156,729 B2 * | 10/2015 | McGinnis | C03C 3/062 |
| 2018/0005847 A1 * | 1/2018 | Fagan | B29C 66/73 |
| 2019/0106352 A1 | 4/2019 | Nojima et al. | |
| 2019/0161387 A1 * | 5/2019 | Nomura | G02F 1/1333 |

FOREIGN PATENT DOCUMENTS

| CN | 106495465 A | 3/2017 |
| JP | 2001-134925 A | 5/2001 |
| JP | 2009-286681 A | 12/2009 |
| JP | 2016-160135 A | 9/2016 |

(Continued)

OTHER PUBLICATIONS

International Searching Authority, "International Search Report," issued in connection with International Patent Application No. PCT/JP2019/028892, dated Oct. 8, 2019.

(Continued)

*Primary Examiner* — Vu A Vu
(74) *Attorney, Agent, or Firm* — Foley & Lardner LLP

(57) ABSTRACT

To provide a glass plate having a high Young's modulus and a high devitrification viscosity. A glass includes, in mol % based on oxides: $SiO_2$ of 30.0 to 50.0%; $B_2O_3$ of 10.0 to 30.0%; $Al_2O_3$ of 10.0 to 30.0%; $Y_2O_3$ of 3.0 to 17.0%; and $Gd_2O_3$ of 3.5 to 17.0%, in which $(Gd_2O_3+Y_2O_3)$ is from 16.0 to 22.0%, and $(Gd_2O_3/Y_2O_3)$ is from 0.15 to 7.0.

7 Claims, 1 Drawing Sheet

(56) References Cited

FOREIGN PATENT DOCUMENTS

| | | |
|---|---|---|
| JP | 2017-030997 A | 2/2017 |
| WO | WO-2015/083616 A1 | 6/2015 |
| WO | WO-2017/175552 A1 | 10/2017 |
| WO | WO-2018/003720 A1 | 1/2018 |

OTHER PUBLICATIONS

International Searching Authority, "Written Opinion," issued in connection with International Patent Application No. PCT/JP2019/028892, dated Oct. 8, 2019.

\* cited by examiner

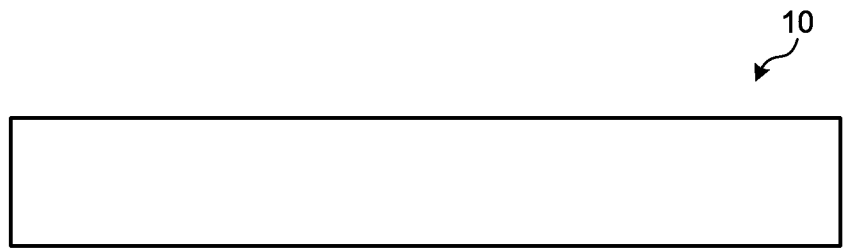

GLASS FOR SEMICONDUCTOR PROCESSING

CROSS-REFERENCE TO RELATED APPLICATION(S)

This application is a continuation of International Application No. PCT/JP2019/028892, filed on Jul. 23, 2019, the entire contents of which are incorporated herein by reference.

FIELD

The present invention relates to glass.

BACKGROUND

Fan-out wafer level packages (FOWLPs) are proposed as techniques to mount semiconductor devices with high density. The FOWLP is known for using a glass substrate that supports a processing substrate for preventing a change in dimension of the processing substrate (Patent Literature 1).

The manufacturing processes of the FOWLP include a process under high temperature conditions, thereby there is a case causing the substrate to be warped by heat. Particularly, in a case where a ratio of a semiconductor chip to the processing substrate is small with a ratio of a sealing material to the processing substrate being large, stiffness of the whole layered body is reduced, resulting in the processed substrate that is easily warped in the process.

As a countermeasure for the problem, a technique (Patent Literature 2) is known that reduces a warp of the layered body by increasing a Young's modulus of a support glass substrate for FOWLP. The Young's modulus is, however, about 80 to 90 GPa. This level is not enough for current market requirements with required performances further increasing.

Glass having a high Young's modulus (Patent Literature 3) is known that has a Young's modulus of over 100 GPa. It is, however, difficult for the glass to be formed into a plate shape without crystal precipitation from a devitrification viscosity point of view. The glass is, thus, not suitable for industrial continuous production.

CITATION LIST

Patent Literature

Patent Literature 1: Japanese Laid-open Patent Publication No. 2017-30997
Patent Literature 2: Japanese Laid-open Patent Publication No. 2016-160135
Patent Literature 3: Japanese Laid-open Patent Publication No. 2001-134925

SUMMARY

Technical Problem

Under such circumstances, glass is required that has a high Young's modulus and a high devitrification viscosity.

Solution to Problem

A glass of the present invention comprises, in mol % based on oxides:
$SiO_2$ of 30.0 to 50.0%;
$B_2O_3$ of 10.0 to 30.0%;
$Al_2O_3$ of 10.0 to 30.0%;
$Y_2O_3$ of 3.0 to 17.0%; and
$Gd_2O_3$ of 3.5 to 17.0%, wherein
$(Gd_2O_3+Y_2O_3)$ is from 16.0 to 22.0%, and
$(Gd_2O_3/Y_2O_3)$ is from 0.15 to 7.0.

Advantageous Effects of Invention

The present invention makes it possible to industrially manufacture glass having a high Young's modulus and a high devitrification viscosity.

BRIEF DESCRIPTION OF DRAWINGS

The FIGURE is a schematic diagram of a glass according to an embodiment.

DESCRIPTION OF EMBODIMENT

The following describes a glass of an embodiment. The FIGURE is a schematic diagram of the glass according to the embodiment. A glass 10 of the embodiment is a glass plate having a plate like shape, but the glass 10 can have any shape.

[Glass Components]

The glass 10 of the embodiment includes a combination of essential components and optional components. The essential components are essentially contained in the glass 10 and achieve major functions of the performance. The optional components are used if needed. In the present specification, unless there is a specific description in the present specification, a percentage of a glass component means mol % based on oxides. The numerical range includes a rounding off range.

[Essential Components]

<$SiO_2$>

$SiO_2$ is a component that imparts strength and crack resistance to glass and enhances stability and chemical durability of the glass. The content of $SiO_2$ in the glass 10 of the embodiment is from 30.0% to 50.0%, and preferably from 35.0% to 45.0%. The content in this range makes it possible to achieve both a high Young's modulus and a high devitrification viscosity. A phrase that the content is from 30.0% to 50.0% indicates that the content is equal to or larger than 30.0% and equal to or smaller than 50.0% in a case where the mol % of the whole of the glass is 100%. The content in the following description is expressed in the same manner.

<$B_2O_3$>

$B_2O_3$ is a component that prevents devitrification of glass and enhances mechanical characteristics such as strength and crack resistance of the glass. The content of $B_2O_3$ in the glass 10 of the embodiment is from 10.0% to 30.0%, and preferably from 15.0% to 25.0%. The content in this range makes it possible to greatly increase the devitrification viscosity while preventing influence on the Young's modulus.

<$Al_2O_3$>

$Al_2O_3$ is a component that increases the Young's modulus. The content of $Al_2O_3$ in the glass 10 of the embodiment is from 10.0% to 30.0% and, preferably from 15.0% to 25.0%.

The content in this range makes it possible to greatly increase the Young's modulus while preventing influence on the devitrification viscosity.

<$Y_2O_3$>

$Y_2O_3$ is a component that increases the Young's modulus. The content of $Y_2O_3$ in the glass 10 of the embodiment is from 3.0% to 17.0% and, preferably from 9.0% to 14.0%. The content in this range makes it possible to achieve both the high Young's modulus and the high devitrification viscosity.

<$Gd_2O_3$>

$Gd_2O_3$ is a component that increases the Young's modulus. The content of $Gd_2O_3$ in the glass 10 of the embodiment is from 3.5% to 17.0% and, preferably from 6.0% to 11.0%. The content in this range makes it possible to achieve both the high Young's modulus and the high devitrification viscosity.

<($Gd_2O_3+Y_2O_3$) and ($Gd_2O_3/Y_2O_3$)>

Values of ($Gd_2O_3+Y_2O_3$) and ($Gd_2O_3/Y_2O_3$) are important elements for achieving both the high Young's modulus and the high devitrification viscosity in the glass 10 of the embodiment. ($Gd_2O_3+Y_2O_3$) is the total content of $Gd_2O_3$ and $Y_2O_3$ in the glass 10 of the embodiment. ($Gd_2O_3/Y_2O_3$) is a ratio of the content of $Gd_2O_3$ to the content of $Y_2O_3$ in the glass 10 of the embodiment.

The content of ($Gd_2O_3+Y_2O_3$) in the glass 10 of the embodiment is from 16.0% to 22.0% and, preferably from 19.0% to 21.0%.

The range of ($Gd_2O_3/Y_2O_3$) in the glass 10 of the embodiment is from 0.15 to 7.0 and, preferably from 0.5 to 2.0.

The content and the ratio in those respective ranges make it possible to achieve both the high Young's modulus and the high devitrification viscosity.

[Optional Components]

The glass 10 of the embodiment may allow use of trace components and additives that are usually used in manufacturing of glass in a range that does not impair the effects of the invention. For example, known refining agents may be used.

[Glass Composition]

The glass 10 of the embodiment includes the following compounds, in mol % based on oxides:

$SiO_2$ of 30.0 to 50.0%,
$B_2O_3$ of 10.0 to 30.0%,
$Al_2O_3$ of 10.0 to 30.0%,
$Y_2O_3$ of 3.0 to 17.0%, and
$Gd_2O_3$ of 3.5 to 17.0%, in which ($Gd_2O_3+Y_2O_3$) is from 16.0 to 22.0%. Furthermore, in the glass 10 of the embodiment, ($Gd_2O_3/Y_2O_3$) is from 0.15 to 7.0.

The glass 10 of the embodiment preferably includes the following compounds, in mol % based on oxides:

$SiO_2$ of 35.0 to 45.0%;
$B_2O_3$ of 15.0 to 25.0%;
$Al_2O_3$ of 15.0 to 25.0%;
$Y_2O_3$ of 9.0 to 14.0%; and
$Gd_2O_3$ of 6.0 to 11.0%.

The glass 10 of the embodiment particularly preferably includes the following compounds, in mol % based on oxides:

$SiO_2$ of 35.0 to 45.0%,
$B_2O_3$ of 15.0 to 25.0%,
$Al_2O_3$ of 15.0 to 25.0%,
$Y_2O_3$ of 9.0 to 14.0%, and
$Gd_2O_3$ of 6.0 to 11.0%, in which ($Gd_2O_3+Y_2O_3$) is from 19.0 to 21.0%. In the glass 10 of the embodiment, particularly preferably ($Gd_2O_3/Y_2O_3$) is from 0.5 to 2.0.

The glass 10 of the embodiment preferably has, in mol % based on oxides, glass composition of 95.0% ($SiO_2+B_2O_3+Al_2O_3+Y_2O_3+Gd_2O_3$) 100.0%, more preferably, 99.5% ($SiO_2+B_2O_3+Al_2O_3+Y_2O_3+Gd_2O_3$) 100.0%, and particularly preferably ($SiO_2+B_2O_3+Al_2O_3+Y_2O_3+Gd_2O_3$)=100.0%. The glass 10 can include impurities unavoidable in manufacturing processes therefor, i.e., unavoidable impurities.

The glass 10 of the embodiment including the compounds in the respective ranges can achieve both the high Young's modulus and the high devitrification viscosity.

[Physical Properties of Glass]

The glass 10 of the embodiment preferably has Young's modulus (E) of 110 GPa≤E, and particularly preferably 115 GPa≤E. The Young's modulus (E) in the range makes it possible to further reduce a warp of the layered body when the glass of the embodiment is used as the support substrate.

The glass 10 of the embodiment preferably has devitrification viscosity (log η) of 1.96 log η, more preferably 2.00 log η, and particularly preferably 2.10 log η. The devitrification viscosity (log η) in the range causes the devitrification to hardly occur in manufacturing of the glass, thereby making it easy to manufacture the glass.

[Manufacturing Method of Glass]

The manufacturing method of the glass 10 of the embodiment is not particularly limited. Existing manufacturing methods of sheet glass can be used. For example, known techniques such as a float method, a fusion method, and a roll-out method can be used.

[Uses of Glass]

The glass 10 of the embodiment can be preferably used as the support glass substrate because of a small warp.

The glass 10 of the embodiment is particularly preferable to the support substrate of a semiconductor, more specifically, to the support glass substrate in manufacturing of the FOWLP. The glass 10 of the embodiment can be reused after being peeled off. More specifically, the glass 10 of the embodiment is preferably used as a peelable support substrate in semiconductor manufacturing processes.

The following specifically describes the invention with examples and comparative examples. The embodiment can be appropriately changed only as long as the embodiment provides the effects of the invention.

[Evaluation Samples]

As evaluation samples, glass plates were prepared that have the respective compositions described in Table 1 and each have a length of 25 mm, a width of 25 mm, and a thickness of 1.0 mm.

<Measurement Method>

[Young's Modulus (E)]

Measurement of the Young's modulus (E) was performed on the evaluation samples using the ultrasonic Young's modulus measurement device 38DL manufactured by OLYMPUS. The Young's modulus (E) of each evaluation sample was determined on the basis of the following criterion, and good and fair were accepted.

Good: 115≤GPa E
Fair: 110 GPa E≤115 GPa
Poor: E<110 GPa

[Devitrification Viscosity (log η)]

Each evaluation sample was crushed to cullet having a size of about 1 mm. About 5 g of the cullet was put on a platinum dish and was held for two hours in an electric oven having a temperature set to 1500° C. to melt the cullet. Thereafter, the evaluation sample was transferred to an electric oven having a certain temperature set lower than the melting temperature (1500° C.) to be kept for one hour. Thereafter, whether the evaluation sample includes crystals was checked by an optical microscope. The maximum value of the temperatures set to the electric oven under the condition where the crystals were precipitated was defined as the devitrification temperature. The viscosity of a molten body having a weight of about 300 g was obtained by a rotating crucible method and the devitrification viscosity (log η) was calculated from the viscosity η (dPas) corresponding to the devitrification temperature. The devitrification viscosity (log η) of each evaluation sample was judged on the basis of the following criterion, and excellent, good, and fair were accepted.

Excellent: 2.10≤log η
Good: 2.00≤log η<2.10
Fair: 1.96≤log η<2.00
Poor: log η<1.96

EXAMPLES

Example 1

A glass raw material having been mixed to have the chemical composition illustrated in Table 1 was melted. The melted glass raw material was poured into a mold and solidified to be made as a glass ingot. The glass ingot was sized to have a length of 100 mm, a width of 100 mm, and a height of 10 mm.

The glass ingot was cut by a precise cutting machine. The cut piece was subjected to double-sided polishing by a polishing device using cerium oxide as a polishing agent to be made as the evaluation sample having a length of 25 mm, a width of 25 mm, and a thickness of 1.0 mm. Various measurements were performed on the evaluation sample.

The used precise cutting machine was the ACCUTOM-10 manufactured by STRUERS. The used polishing device was the EJ-380IE manufactured by Engis. In double-sided polishing, each surface was polished for 10 minutes. Table 1 illustrates the evaluation results.

Examples 2 to 6 and Comparative Examples 1 to 8

The same operation as example 1 was performed for each of examples 2 to 6 and comparative examples 1 to 8 except for that the respective compositions were changed to those illustrated in Table 1. Table 1 illustrates the evaluation results.

TABLE 1

| | Glass composition (mol %) | | | | | | | | | | Evaluation | | | |
|---|---|---|---|---|---|---|---|---|---|---|---|---|---|---|
| | $SiO_2$ | $B_2O_3$ | $Al_2O_3$ | $Y_2O_3$ | $Gd_2O_3$ | $La_2O_3$ | $Yb_2O_3$ | Total | $Gd_2O_3 + Y_2O_3$ | $Gd_2O_3/Y_2O_3$ | E (GPa) | | Logη | |
| Example 1 | 40 | 20 | 20 | 10 | 10 | | | 100 | 20.0 | 1.00 | 114 | Fair | 2.2 | Excellent |
| Example 2 | 40 | 20 | 20 | 13 | 7.0 | | | 100 | 20.0 | 0.54 | 115 | Good | 2.2 | Excellent |
| Example 3 | 40 | 20 | 20 | 16 | 4.0 | | | 100 | 20.0 | 0.25 | 115 | Good | 2.1 | Good |
| Example 4 | 40 | 20 | 20 | 3.3 | 16.7 | | | 100 | 20.0 | 5.06 | 116 | Good | 2 | Fair |
| Example 5 | 40 | 20 | 20 | 11 | 11 | | | 102 | 21.6 | 1.00 | 119 | Good | 2 | Good |
| Example 6 | 40 | 20 | 20 | 8.0 | 8.0 | | | 96 | 16.7 | 1.00 | 110 | Fair | 2.2 | Excellent |
| Comparative Example 1 | 40 | 20 | 20 | 2.0 | 1.8 | | | 100 | 20.0 | 9.00 | 114 | Fair | 2 | Poor |
| Comparative Example 2 | 40 | 20 | 20 | 18 | 2.0 | | | 100 | 20.0 | 0.11 | 116 | Good | 1.6 | Poor |
| Comparative Example 3 | 40 | 20 | 20 | 20 | | | | 100 | 20.0 | 0.00 | 115 | Good | 1.6 | Poor |
| Comparative Example 4 | 40 | 20 | 20 | | 20 | | | 100 | 20.0 | — | 114 | Fair | 1.8 | Poor |
| Comparative Example 5 | 40 | 20 | 20 | 10 | | 10 | | 100 | 10.0 | 0.00 | 109 | Poor | 2.3 | Excellent |
| Comparative Example 6 | 40 | 20 | 20 | 10 | | | 10 | 100 | 10.0 | 0.00 | 117 | Good | 1.6 | Poor |
| Comparative Example 7 | 40 | 20 | 20 | 12 | 12 | | | 104 | 23.1 | 1.00 | 119 | Good | 1.7 | Poor |
| Comparative Example 8 | 40 | 20 | 20 | 7.5 | 7.5 | | | 95 | 15.8 | 1.00 | 108 | Poor | 1.9 | Poor |

The invention claimed is:

1. A glass comprising, in mol % based on oxides:
$SiO_2$ of 30.0 to 50.0%;
$B_2O_3$ of 10.0 to 30.0%;
$Al_2O_3$ of 10.0 to 30.0%;
$Y_2O_3$ of 3.0 to 17.0%; and
$Gd_2O_3$ of 3.5 to 17.0%, wherein:
($Gd_2O_3+Y_2O_3$) is from 16.0 to 22.0%;
($Gd_2O_3/Y_2O_3$) is from 0.15 to 7.0;
the glass has a modulus of equal to or larger than 110 GPa; and
the glass has a devitrification viscosity log η of equal to or larger than 1.95.

2. The glass according to claim 1, wherein the glass includes, in mol % based on oxides:
$SiO_2$ of 35.0 to 45.0%;
$B_2O_3$ of 15.0 to 25.0%;
$Al_2O_3$ of 15.0 to 25.0%;
$Y_2O_3$ of 9.0 to 14.0%; and
$Gd_2O_3$ of 6.0 to 11.0%.

3. The glass according to claim 1, wherein, in mol % based on oxides,
($Gd_2O_3+Y_2O_3$) is from 19.0 to 21.0%, and
($Gd_2O_3/Y_2O_3$) is from 0.5 to 2.0.

4. The glass according to claim 1, wherein, in mol % based on oxides, 95.0%≤($SiO_2+B_2O_3+Al_2O_3+Y_2O_3+Gd_2O_3$)≤100.0%.

5. The glass according to claim 1, wherein the devitrification viscosity log η is equal to or larger than 2.00.

6. The glass according to claim 1, wherein the glass is used as a support substrate of a semiconductor.

7. The glass according to claim 1, wherein the glass is used as a peelable support substrate in a semiconductor manufacturing process.

* * * * *